(12) United States Patent
Ireland et al.

(10) Patent No.: US 7,003,708 B1
(45) Date of Patent: Feb. 21, 2006

(54) METHOD AND APPARATUS FOR GENERATING BIT ERRORS WITH A POISSON ERROR DISTRIBUTION

(75) Inventors: Howard H. Ireland, Woodstock, GA (US); Jeffery T. Nichols, Marietta, GA (US)

(73) Assignee: CIENA Corporation, Linthicum, MD (US)

( * ) Notice: Subject to any disclaimer, the term of this patent is extended or adjusted under 35 U.S.C. 154(b) by 435 days.

(21) Appl. No.: 10/365,877

(22) Filed: Feb. 13, 2003

Related U.S. Application Data

(60) Provisional application No. 60/359,274, filed on Feb. 21, 2002.

(51) Int. Cl.
*G06F 11/00* (2006.01)
*H03M 13/00* (2006.01)

(52) U.S. Cl. ..................... 714/739; 714/782

(58) Field of Classification Search ........... 714/738, 714/739, 814, 815, 819, 746, 752, 761, 781–784, 714/786, 787; 708/250, 315, 253–256, 420; 370/342–344
See application file for complete search history.

(56) References Cited

U.S. PATENT DOCUMENTS

| 3,614,399 | A | * | 10/1971 | Linz | 708/250 |
| 6,816,992 | B1 | * | 11/2004 | Eby | 714/739 |
| 6,859,465 | B1 | * | 2/2005 | Colban | 370/506 |

* cited by examiner

*Primary Examiner*—Christine T. Tu
(74) *Attorney, Agent, or Firm*—Dougherty Clements; Christopher L. Bernard; Tyler S. Brown

(57) ABSTRACT

A method and apparatus that enable a Poisson distribution to be approximated by generating random bit sequences over a number of clock cycles. The apparatus of the present invention comprises a Poisson distribution module that includes logic configured to modulo-2 add at least two pseudo-random bit sequences (PRBSs) together to generate a number of PRBSs, which are then compared to a threshold bit sequence. The result of the comparison is a random bit sequence. Over a number of clock cycles, the random bit sequences produced approximate a Poisson distribution. The present invention can be used to evaluate the performance of communications systems by modulo-2 adding these random bit sequences with encoded data words to insert errors into the encoded data words, and then determining how well the communications system decodes and corrects the errors in the encoded data words. The present invention is particularly useful in this environment because the true distribution of errors in encoded data words transmitted over communications links generally is Poisson in nature.

18 Claims, 4 Drawing Sheets

METHOD AND APPARATUS FOR GENERATING BIT ERRORS WITH A POISSON ERROR DISTRIBUTION

CROSS-REFERENCE TO RELATED APPLICATIONS

This application claims priority to a provisional application that was filed on Feb. 21, 2002, entitled OC-192 Forward Error Correction and Sonet Transport Overhead ASIC Functional Specification, having Ser. No. 60/359,274, which is incorporated by reference herein in its entirety.

TECHNICAL FIELD OF THE INVENTION

The present invention relates to communications and, more particularly, to a method and apparatus for generating bit errors with a Poisson distribution, which can be used in a communications system, such as, for example, a forward error correction (FEC) system, to check the performance characteristics of the communications system.

BACKGROUND OF THE INVENTION

When information is transmitted over a communications link between a receiver and a transmitter, the bits that describe the information being transmitted can be corrupted. In other words, the receiver may determine that a received bit that is supposed to be a binary 1 is a binary 0, and vice versa. Corruption of bits in a data stream may be caused by a variety of factors or components in the communications link. For example, in an optical fiber network, optical energy is transmitted in the form of optical pulses that have particular levels that correspond to binary 1s and 0s. If the level of the optical energy is too low, the receiver can have difficulty determining whether a pulse corresponds to a binary 1 or a binary 0. Repeaters, or amplifiers, normally are disposed at particular locations along the communications link that amplify the optical signals so that they are at the proper levels to enable the receiver to determine whether it has received a binary 1 or a binary 0. Typically, the optical signals are converted into electrical signals at the repeaters. The electrical signals are then amplified and converted into optical signals, which are then modulated back onto the optical fiber. Similarly, at the receiver, the optical signals typically are converted back into electrical signals, which the receiver compares to a threshold value to determine whether it has received a binary 1 or a binary 0.

Because it is possible for the bits to be corrupted, techniques have been developed and implemented that provide error correction. In other words, if a bit received by the receiver is erroneously determined to be a binary 1 when it was meant to be a binary 0 when it was transmitted, and vice versa, receivers utilize various techniques to determine whether a bit value has been incorrectly identified and to correct the bit value. One known technique used for such purposes is generally referred to as the "Automatic Request To Transmit" (ARM) technique. In accordance with this technique, when the receiver detects a bit error, it sends a signal to the transmitter that tells the transmitter to retransmit the block of data that contained the error. The receiver processes the retransmitted data block and detects bit errors. The data block may need to be retransmitted several times before the receiver determines that the data is without error. Of course, retransmitting data utilizes bandwidth and generally slows down the overall throughput of the communications system.

A technique known as Forward Error Correction (FEC) is commonly used in the communications industry to reduce errors in data being transmitted over a communications link without requiring retransmission of data. FEC not only detects bit errors, but corrects detected bit errors. One of the primary advantages of FEC over ARM is that no retransmission of data is required with FEC. This is because FEC techniques introduce redundancy in the data bits that enables the receiver of a communications system to detect errors in data being transmitted and to correct the detected errors. The redundancy generally is introduced by utilizing data bits from the data stream to encode the data stream. The receiver has a decoder that has intelligence with regard to the encoding scheme used by the transmitter, which enables the receiver to decode the data and detect and correct errors without the need for retransmission. Another advantage of FEC is that, because it does not require retransmission of data, simplex links can be used, which is desirable in certain situations, such as when the receivers are receive-only terminals.

Generally, FEC techniques and systems fall into two broad categories, namely, block coding and convolution coding. Various block coding and convolution coding techniques are currently in use in the communications industry. In the past, the use of block codes has generally been limited to use in communications systems that have relatively low data rates for various reasons, such as the aforementioned adverse effects on overall coding gain (signal-to-noise ratio, $E_b/N_o$), which is expressed in decibels (dB), for short data bursts and the reduced overall throughput that can result from the synchronization requirement. Convolution coding has generally been the preferred FEC technique for high data rate implementations. However, convolution coding results in higher output bit error rates (BER) than the output (BERs) that can be achieved using block coding. Some customers want FEC systems with very low BERs (e.g., $10^{-15}$), which generally cannot be achieved using convolution coding, but which can be achieved using block coding, such as Bose-Chaudhuri-Hocquenghem (BCH) block coding, for example.

It is difficult to characterize the performance of FEC systems without having to first set a desired signal-to-noise ratio through analog methods. A Poisson Error Distribution is the type of error distribution that is found in Binary Symmetric Channels, which are common in many communication systems. It would be desirable to provide a method and apparatus for erroring encoded bit sequences in a way that closely approximates a Poisson probability distribution to enable the performance characteristics of communications systems to be more accurately determined.

Accordingly, a need exists for a method and apparatus generating errors with a distribution that closely approximates a Poisson probability distribution.

SUMMARY OF THE INVENTION

The present invention provides a method and apparatus that enable a Poisson distribution to be approximated. In accordance with the present invention, random bit sequences are generated over a number of clock cycles, and the pattern of the random bit sequences over time approximates a Poisson distribution. The apparatus of the present invention comprises a Poisson distribution module that includes logic configured to modulo-2 add at least two pseudo-random bit sequences (PRBSs) together to generate a number of PRBSs, which are then compared by comparator logic to a threshold bit sequence. The result of each comparison of a PRBS with the threshold bit sequence is either a logic 1 or a logic 0. The PRBSs are compared to the threshold bit sequence simultaneously by the comparator logic during a clock cycle, thereby resulting in a random bit sequence being output from the comparator logic (i.e., from the Poisson distribution module) every clock cycle. Over a number of clock cycles, the random bit sequences produced approximate a Poisson distribution.

The present invention can be used to evaluate the performance of communications systems by modulo-2 adding these random bit sequences with encoded data words to insert errors into the encoded data words, and then determining how well the communications system decodes and corrects the errors in the encoded data words. The present invention is particularly useful in this environment because the true distribution of errors in encoded data words transmitted over communications links generally is Poisson in nature.

These and other features and advantages of the present invention will become apparent from the following description, drawings and claims.

DETAILED DESCRIPTION OF THE PREFERRED EMBODIMENT OF THE INVENTION

The present invention provides a method and apparatus that enable errors to be generated with a Poisson distribution. The apparatus of the present invention comprises a Poisson distribution module that generates the Poisson distribution bit errors. The present invention enables the performance of a communications system, such as, for example, a Forward Error Correction (FEC) system to be characterized without having to set a desired signal-to-noise ratio through analog methods. In other words, the errors generated by the Poisson distribution module can be modulo-2 added to an encoded word, such as an FEC encoded word, and the ability of the FEC decoder to detect and correct the errors provides an assessment of the performance capabilities of the FEC system. It should be noted that although the present invention has thus far been discussed with reference to its use with FEC systems, the Poisson distribution module of the present invention can be used in any environment where it is desirable or necessary to generate errors with a Poisson distribution.

Figure 1:
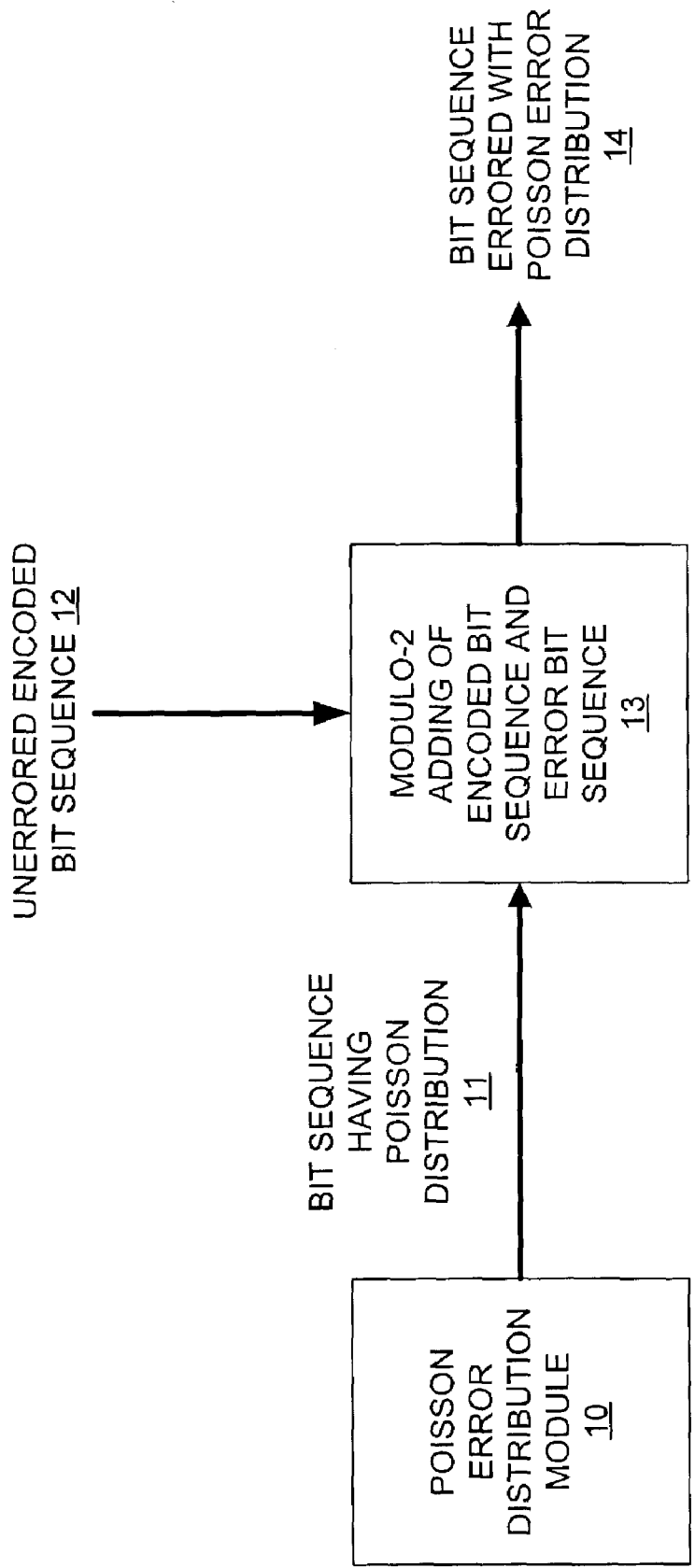
FIG. 1 is a block diagram of the apparatus of the present invention in accordance with an example embodiment for generating errors with a Poisson distribution and for introducing those errors into an FEC encoded bit stream.

FIG. 1 is a block diagram that illustrates the manner in which the Poisson distribution module 10 of the present invention can be used to error an encoded data word. As stated above, such an implementation of the present invention would enable a user to determine how well the decoder detects and corrects the errors inserted into the encoded data word, which may be, for example, an FEC encoded data word. The Poisson error distribution module 10 of the present invention generates a bit sequence 11 having a Poisson error distribution. This bit sequence is modulo-2 added to an unerrored encoded bit sequence (e.g., an unerrored encoded FEC data word) 12 by modulo-2 addition logic 13 to produce a bit sequence 14 that has a Poisson error distribution. The manner in which the Poisson distribution module may be configured will now be discussed with reference to FIG. 2.

Figure 2:
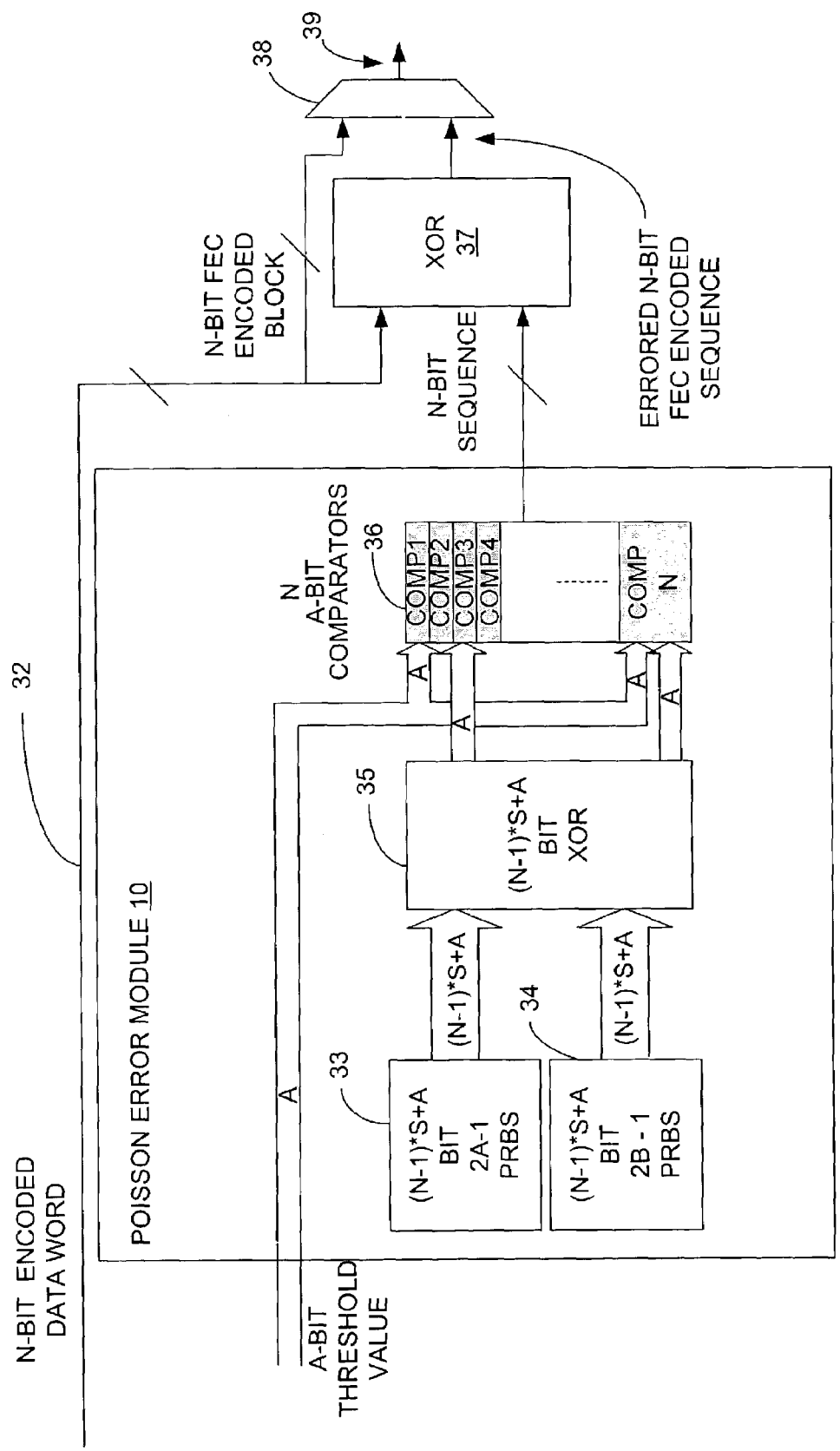
FIG. 2 is a detailed block diagram of an example embodiment of the Poisson distribution module shown in FIG. 1.

FIG. 2 is a detailed block diagram of an example embodiment of the Poisson distribution module 10 shown in FIG. 1. The module 10 comprises a first PRBS, which is represented by block 33, and a second PRBS, which is represented by block 34. The PRBSs 33 and 34 are modulo-2 added together by Exclusive-OR (XOR) logic 35, and the result is compared to an A-bit threshold value by comparator logic 36, where A corresponds to the highest order of the polynomials associated with the PRBSs 33 and 34. The ratio of the threshold to A determines the generated bit error rate (BER). The polynomial associated with block 33 is of order of A and the polynomial associated with block 34 is of order of B, where A>B. Each PRBS has a number of bits equal to (N−1)*S+A, where N=internal data width, S=number of bits between subsequent A-bit comparisons (A corresponding to the order of the highest order polynomial associated with the PRBS sequences (31 in this example)). Preferably, the polynomials associated with PRBSs 33 and 34 are of different order, but are of the same type. Also, although only two PRBSs are shown in FIG. 2, more than two PRBSs can be used to achieve the randomness needed to approximate a Poisson distribution.

The comparison logic 36 performs N, A-bit comparisons and outputs an N-bit sequence. A random N-bit sequence is generated every system clock cycle, and over many N-bit sequences, the resulting distribution of binary 1's closely approximates the Poisson distribution. Thus, for every system clock cycle, the module 10 outputs an N-bit sequence. Over time, these N-bit sequences approximate a Poisson distribution. In the case where it is desirable to insert errors into an N-bit encoded data word, such as an unerrored N-bit FEC encoded data word, for example, the N-bit sequence output from the comparator logic 36 is modulo-2 added to the N-bit unerrored data word by XOR logic 37 to produce an N-bit word having an error distribution that approximates a Poisson distribution. In the case where the Poisson distribution module 10 is used for such a purpose, under normal operations, the unerrored N-bit FEC encoded data word would be selected by the multiplexer and output at output 39 every clock cycle, whereas the N-bit errored sequence would be selected by the multiplexer 38 and output at output 39 every clock cycle when the performance characteristics of a decoder are being assessed.

A general equation giving the total number of bits M that need to be operated on by the comparator logic 36 simultaneously every clock cycle, given a parallel data word of N-bits and a highest-order PRBS polynomial of order A, is given by: $M=(N-1)*S+A$. In this equation, the term S corresponds to the bit separation between subsequent comparisons of the output bits of the XOR logic 35 by the comparator logic 36. Through experimentation, it was determined that if the outputs from the XOR logic 35 that connect to the comparison logic 36 are bit-separated from the bits used for subsequent comparisons by at least a few bits (e.g., approximately 7 or more), a very good Poisson error approximation will be obtained, whereas if this is not done, the bit error sequences may be too highly correlated, and the Poisson error approximation may not be as good. In accordance with the preferred embodiment, bit separation is accomplished by wiring the XOR logic 35 to the comparator logic 36 in such a way that bit separation is achieved. In addition, if a small bit separation is not employed, a very large number of logic gates may be needed to perform the XOR and generate the PRBS sequences. For example, where a given number of error bits need to be generated within an N-bit word each clock cycle, an A-bit separation would require $(N-1)*A$-bit XOR logic to generate each A-bit comparator value and $(N-1)*A$-bit PRBS generators. Using a bit separation less than A-bits results in a $(1-A/S)*100$ percent reduction in the logic gates required to implement the invention than might otherwise be required.

In an experiment, the following polynomials were chosen for orders A=31 and B=29:

$2^{31}-1$ PRBS: $Y_M = Y_{M-30} + Y_{M-27}$ $2^{29}-1$ PRBS: $Y_M = Y_{M-28} + Y_{M-26}$

Figure 3:
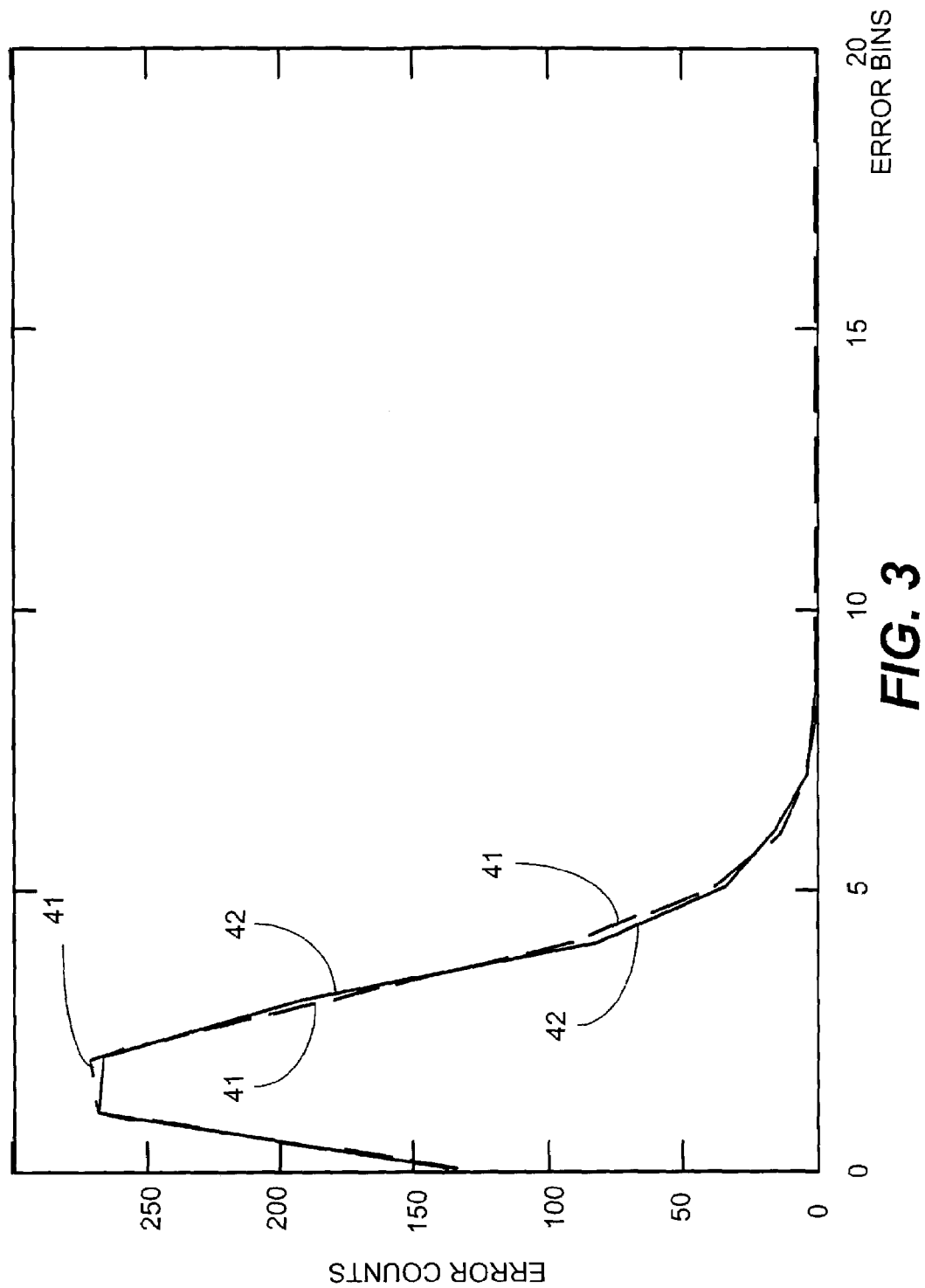
FIG. 3 is a graph illustrating an ideal Poisson distribution versus the Poisson distribution approximation of errors produced by the Poisson distribution module shown in FIG. 2.

To verify the Poisson error distribution achieved by the present invention, errors were generated using a 31-bit comparison threshold of 20C49C in hexadecimal notation or 2147484 in decimal notation. This resulted in approximately a $2147484/(2^{31}-1)$ or $10^{-3}$ bit error rate (BER). The internal data path width, N, was 128. The total number of errors blocks collected were 1000. Each error block represented the total number of errors generated in 16 sequential 128-bit error words. These errors blocks were then histogrammed into 20 bins to determine the distribution, which is shown in FIG. 3. The 20-bin Poisson approximation was obtained by evaluating the normalized probability distribution function for an ideal Poisson random variable, represented by the formula $(\lambda^k/k!)e^{-\lambda}$, for each of the 20 bins (k) using a mean ($\lambda$) of 2.011, which was obtained from the 1000 error samples. FIG. 3 shows the distribution comparison and illustrates how close the error distribution approximation produced by the present invention is to the ideal Poisson distribution. As stated above, the ideal Poisson distribution is represented by the solid line 42 and the Poisson distribution obtained from the invention is represented by the dashed line 41.

Figure 4:
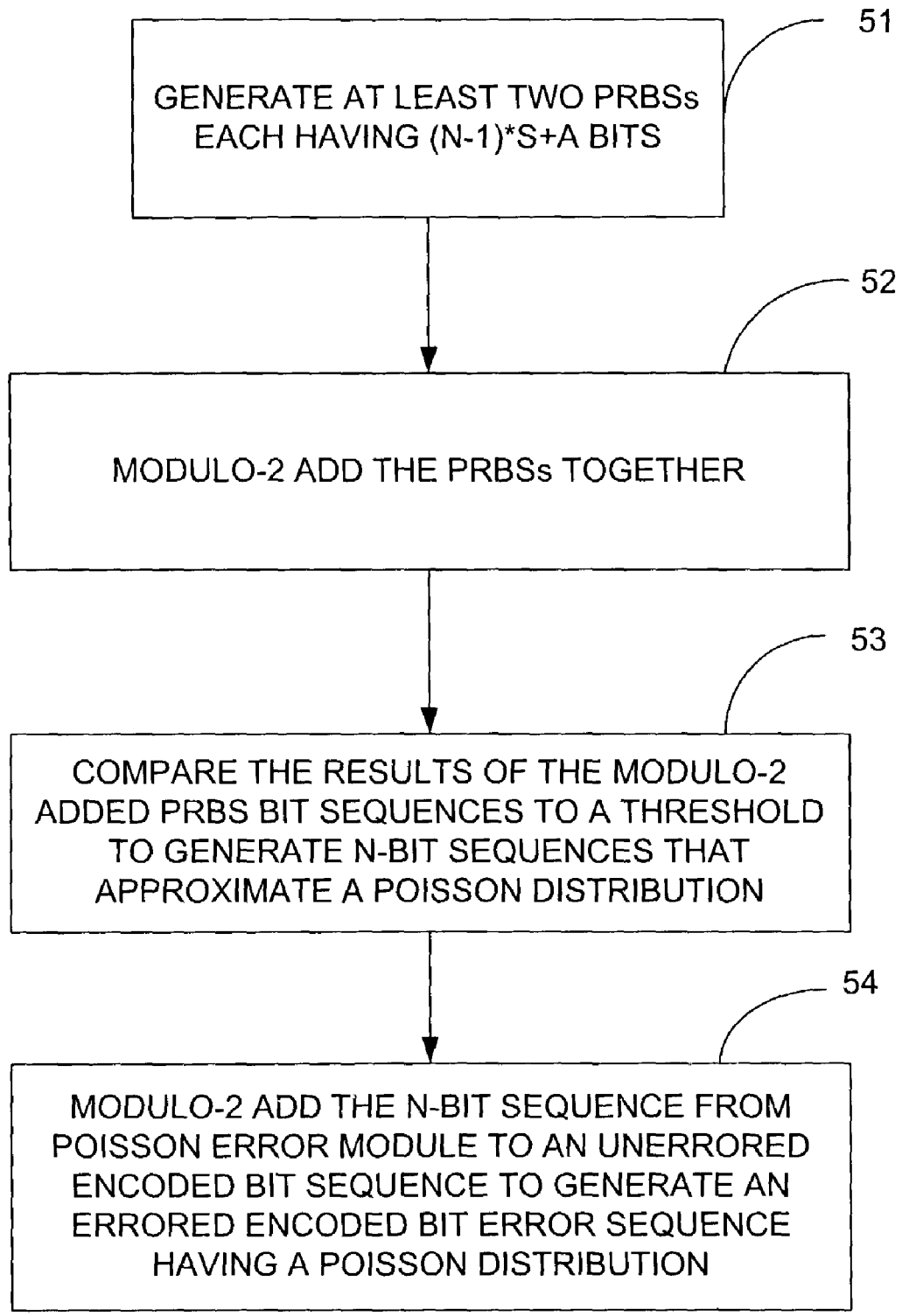
FIG. 4 is a flow chart illustrating the method of the present invention in accordance with an example embodiment for producing a Poisson error distribution.

FIG. 4 is a flow chart demonstrating the method of the present invention in accordance with the preferred embodiment. It should be noted that although the ordering of the blocks of the flow chart implies that the steps of the method are performed in some particular sequence, the method is not limited in this regard. Some of the steps may be performed in parallel with other steps, or in an order other than that implied by the ordering of the blocks in FIG. 4. As indicated by block 51, at least two PRBSs are generated, each having $(N-1)*S+A$ bits. The PRBSs are then modulo-2 added together by the aforementioned XORing logic, as indicated by block 52. The results of the modulo-2 addition are then compared to threshold values to generate N-bit sequences having distributions that approximate the Poisson distribution, as indicated by block 53. This error sequence may then be modulo-2 added to an unerrored encoded bit sequence, such as an encoded FEC sequence, for example, to produce an errored encoded bit sequence, as indicated by block 54. The step represented by block 54 is optional, and would generally be used only when the performance of a communications system was being assessed. As indicated above, the Poisson distribution module of the present invention is not limited to any particular uses.

It should be noted that the present invention has been described with reference to particular embodiments for the purposes of demonstrating the principles and concepts of the present invention. Those skilled in the art will understand that present invention is not limited to these example embodiments. Also, those skilled in the art will understand, in view of the present disclosure, that a variety of logical configurations can be used to achieve the goals of the present invention. FIG. 3 is merely one example of the way in which Poisson error sequences can be generated and inserted into the encoded data stream. It should also be noted that although the present invention has been described herein as being performed in hardware in an ASIC, the present invention may be implemented in hardware, in a combination of hardware and software, in a microprocessor, in a field programmable gate array, etc. Those skilled in the art will understand the way in which the tasks discussed herein can be performed by a variety of such physical implementations. Those skilled in the art will understand that a variety of changes can be made to the configuration showed in FIG. 3 and that all such modifications are within the scope of the present invention.

What is claimed is:

1. A Poisson distribution apparatus comprising logic configured to generate random bit sequences comprising N bits, the logic being controlled by a clock, and wherein after a given number of cycles of the clock, the N-bit sequences output from the logic have errors with a distribution that approximates a Poisson distribution, wherein the logic includes:

at least first modulo-2 addition logic configured to modulo-2 add at least first and second pseudo-random bit sequences (PRBSs) together each clock cycle to generate N, A-bit PRBS each clock cycle;

comparator logic configured to compare each of the N, A-bit RPBSs to an A-bit threshold sequence each clock cycle to generate one of said random N-bit sequences each clock cycle.

2. The apparatus of claim 1, wherein said logic further includes:

a pseudo-random bit sequence (PRBS) generator, the PRBS generator generating the least first and second pseudo-random bit sequences (PRBSs) based on two respective polynomials of different order.

3. The apparatus of claim 2, wherein the first and second polynomials are of a same type.

4. The apparatus of claim 2, wherein A corresponds to an order of the first polynomial, the order of the first polynomial being higher than an order of the second polynomial.

5. The apparatus of claim 2, further comprising second modulo-2 addition logic, the second modulo-2 addition logic receiving an encoded data word comprising N-bits and one of said random N-bit sequences, the N-bit encoded data word being modulo-2 added together with said one of said random N-bit sequences to produce an errored N-bit encoded data word.

6. The apparatus of claim 5, wherein an N-bit encoded data word is modulo-2 added together with one of said random N-bit sequences every clock cycle such that an errored N-bit encoded data word is produced every clock cycle, and wherein after a given number of clock cycles, an error distribution associated with the errored N-bit data words produced over the given number of clock cycles approximates a Poisson distribution.

7. The apparatus of claim 6, wherein each N-bit encoded data word is a data word that has been encoded using a forward error correction (FEC) technique.

8. The apparatus of claim 7, wherein the FEC technique utilizes block coding.

9. The apparatus of claim 8, wherein the block coding is Bose-Chaudhuri-Hocquenghem (BCH) block coding.

10. A method for approximating a Poisson distribution, the method comprising:

generating random bit sequences each comprising N bits by modulo-2 addition of at least first and second pseudo-random bit sequences (PRBS) for plurality of clock cycles over a period of time until a particular number of the N-bit random sequences have been generated, wherein when said at least first and second PRBSs are modulo-2 added together, N, A-bit pseudo-random bit sequences (PRBSs) are produced, and wherein the method further comprises the step of:

comparing each of said N, A-bit PRBSs to an A-bit threshold sequence each clock cycle to generate one of said random N-bit sequences each clock cycle.

11. The method of claim 10, wherein the first and second polynomials are of a same type.

12. The method of claim 10, wherein A corresponds to an order of the first polynomial, the order of the first polynomial being higher than an order of the second polynomial.

13. The method of claim 10, further comprising the step of modulo-2 adding together an encoded data word comprising N-bits and one of said random N-bit sequences each clock cycle to produce an errored N-bit encoded data word each clock cycle.

14. The method of claim 13, wherein after a given number of clock cycles, an error distribution associated with the errored N-bit data words produced over the given number of clock cycles approximates a Poisson distribution.

15. The method of claim 14, wherein each N-bit encoded data word is a data word that has been encoded using a forward errorr correction (FEC) technique.

16. The method of claim 15, wherein the FEC technique utilizes block coding.

17. The method of claim 16, wherein the block coding is Bose-Chaudhuri-Hocquenghem (BCH) block coding.

18. A computer program for approximating a Poisson distribution, the computer program being embodied on a computer-readable medium, the computer-readable medium comprising:

a routine for generating random bit sequences each comprising N bits by modulo-2 addition of at least first and second pseudo-random bit sequences (PRBS) for plurality of clock cycles over a period of time until a particular number of the N-bit random sequences have been generated, wherein when said at least first and second PRBSs are modulo-2 added together, N, A-bit pseudo-random bit sequences (PRBSs) are produced, and wherein the routine further comprises:

a code segment for comparing each of said N, A-bit PRBSs to an A-bit threshold sequence each clock cycle to generate one of said random N-bit sequences each clock cycle.

* * * * *